United States Patent
Choi et al.

(10) Patent No.: US 12,431,171 B2
(45) Date of Patent: Sep. 30, 2025

(54) PAGE BUFFER, SEMICONDUCTOR DEVICE INCLUDING PAGE BUFFER, AND OPERATING METHOD OF SEMICONDUCTOR DEVICE

(71) Applicant: SK hynix Inc., Icheon-si (KR)

(72) Inventors: Won Jae Choi, Icheon-si (KR); Duck Ju Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 234 days.

(21) Appl. No.: 18/475,028

(22) Filed: Sep. 26, 2023

(65) Prior Publication Data
US 2024/0379137 A1    Nov. 14, 2024

(30) Foreign Application Priority Data
May 9, 2023    (KR) ......................... 10-2023-0059630

(51) Int. Cl.
G11C 7/10    (2006.01)
G11C 7/12    (2006.01)
G11C 8/08    (2006.01)
H03K 19/20   (2006.01)

(52) U.S. Cl.
CPC .................. *G11C 7/10* (2013.01); *G11C 7/12* (2013.01); *G11C 8/08* (2013.01); *H03K 19/20* (2013.01)

(58) Field of Classification Search
CPC .... G11C 7/10; G11C 7/12; G11C 8/08; G11C 7/106; G11C 7/1057; G11C 7/1084; G11C 7/1087; G11C 16/06; G11C 16/08; G11C 16/24; G11C 16/10; G11C 16/20; G11C 16/30; H03K 19/20
USPC ...................................... 365/230.08
See application file for complete search history.

(56) References Cited

U.S. PATENT DOCUMENTS 12,198,782 B2 *    1/2025    Cho ...................... G11C 16/10
2024/0120008 A1 *  4/2024    Choi ..................... G11C 16/24

FOREIGN PATENT DOCUMENTS

| KR | 1020120070445 A | 6/2012 |
| KR | 1020140013401 A | 2/2014 |
| KR | 1020190057800 A | 5/2019 |

* cited by examiner

*Primary Examiner* — Fernando Hidalgo
(74) *Attorney, Agent, or Firm* — WILLIAM PARK AND ASSOCIATES LTD.

(57) ABSTRACT

A page buffer may include a bit line connection circuit configured to connect or disconnect a bit line and a first node, a plurality of latch circuits that is connected to the first node in common. The page buffer may further include, and logical operation circuit configured to perform a logical operation by using one or more of a voltage level of the first node and a voltage level of a second node as an input and to set the voltage level of the first node responsive to results of the operational operation.

22 Claims, 7 Drawing Sheets

| Node_A(Initialization) | Node_B(Setting based on input) | Node_A(Results of operation) |
|---|---|---|
| High | Low | High |
| High | High | Low |

| First input | Second input | Node_A(Setting based on first input) | Node_B(Inverting and setting based on second input) | Node_A (Results of operation) |
|---|---|---|---|---|
| Low | Low | Low | High | Low |
| Low | High | Low | Low | Low |
| High | Low | High | High | Low |
| High | High | High | Low | High |

| First input | Second input | Node_A(Inverting and setting based on first input) | Node_B(Setting based on second input) | Node_A (Results of operation) |
|---|---|---|---|---|
| Low | Low | High | Low | High |
| Low | High | High | High | Low |
| High | Low | Low | Low | Low |
| High | High | Low | High | Low |

PAGE BUFFER, SEMICONDUCTOR DEVICE INCLUDING PAGE BUFFER, AND OPERATING METHOD OF SEMICONDUCTOR DEVICE

CROSS-REFERENCE TO RELATED APPLICATION

This application claims priority under 35 U.S.C. § 119 (a) to Korean Patent Application No. 10-2023-0059630 filed on May 9, 2023, in the Korean Intellectual Property Office, which is incorporated herein by reference in its entirety.

BACKGROUND

1. Technical Field

Embodiments relate to an integrated circuit technology and, more particularly, to a page buffer, a semiconductor device including a page buffer, and a method of operating a semiconductor device having a page buffer.

2. Related Art

A semiconductor device capable of storing information is commonly known as a memory device. Semiconductor memory devices may be classified as either a volatile memory device or a nonvolatile memory device.

Volatile memory devices are generally faster than nonvolatile memory devices. The main disadvantage of a volatile memory device is that it needs to be continuously supplied with power in order to retain data that has been stored in the volatile memory device. Data stored in a volatile memory device is lost when power to the device is interrupted.

A non-volatile memory device does not need to be continuously supplied with power in order to maintain data that has been stored in it but nonvolatile memory devices are generally slower than volatile memory devices.

Nonvolatile memory is being developed which use one memory cell as two memory cells by cutting the one memory cell and thus create more memory cells in the same area.

As nonvolatile memory devices that use one memory cell as two memory cells are developed, research of a nonvolatile memory device in which data is encoded and stored in a memory cell and the data stored in the memory cell is decoded and output is also being carried out. A need exists for a page buffer capable of operating with a nonvolatile memory device which may have new operations such as encoding or decoding.

SUMMARY

In an embodiment, a page buffer may include a bit line connection circuit configured to connect or disconnect a bit line and a first node, a plurality of latch circuits that is connected to the first node in common, and an logical operation circuit configured to perform a logical operation using a voltage level of the first node and a voltage level of a second node as respective inputs and to set the voltage level of the first node based on, i.e., responsive to results of the logical operation.

In an embodiment, a semiconductor device may include a plurality of page buffers connected to a plurality of bit lines, respectively, and connected to a verification node in common, and a control circuit configured to perform a verification operation responsive to a voltage level of the verification node. Each of the plurality of page buffers may include a latch-common node to which a plurality of latch circuits is connected in common, and at least one of the plurality of page buffers may perform a logical operation using the voltage level of the verification node and a voltage level of the latch-common node as inputs.

In an embodiment, an operating method of a semiconductor device may include setting a voltage level of a first node as a first voltage level or a second voltage level, setting a voltage level of a second node as the first voltage level or the second voltage level, and performing a logical operation by using one or more of the voltage levels of the first node and the second node as inputs and outputting the results of the operational operation to the first node.

DETAILED DESCRIPTION

Hereinafter, embodiments according to the technical spirit of the present disclosure are described with reference to the accompanying drawings.

Embodiments of the present disclosure provide a page buffer capable of an operational operation, a semiconductor device using a page buffer, and an operating method of a semiconductor device.

It is possible to increase area efficiency of a page buffer while providing a page buffer capable of an operational operation.

Figure 1:
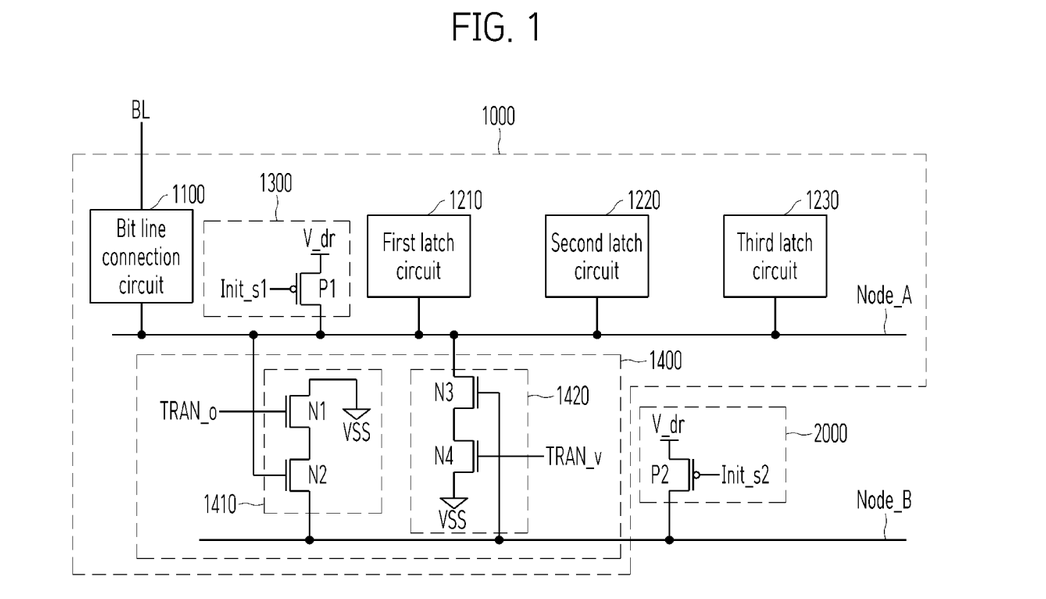
FIG. 1 is a diagram illustrating a construction of a page buffer according to an embodiment of the present disclosure.

FIG. 1 is a diagram illustrating a construction of a page buffer according to an embodiment of the present disclosure.

Referring to FIG. 1, a page buffer 1000 may include a bit line connection circuit 1100, a plurality of latch circuits 1210, 1220, and 1230, a first initialization circuit 1300, and a logical operation 1400. In another embodiment, also depicted in FIG. 1, the page buffer 1000 may include a second initialization circuit 2000.

In FIG. 1, three latch circuits designated as first to third latch circuits 1210, 1220, and 1230 are referred to herein as a plurality of latch circuits 1210, 1220, and 1230. In other embodiments, however, a page buffer 1000 having more than three or less than three latch circuits is still considered as having a plurality of latch circuits.

The bit line connection circuit 1100 may electrically connect or disconnect a bit line BL and a first node Node_A. In FIG. 1, Node A is depicted in FIG. 1 as a line, which should not be construed as depicting the shape or structure of an actual Node A embodiment. Node A may be implemented as an elongated integrated circuit "trace", a conductive via, an elongated conductive trace on a circuit board or a module, which is considered herein as being a relatively small mass of conductive material having either rounded or an irregular shape.

The first to third latch circuits 1210, 1220, and 1230 may be connected in parallel to the first node Node_A. Each latch circuit may store data embodied as a magnitude or level of a voltage or electric potential of the first node Node_A relative to a reference potential. Each latch circuit may also "drive" or force the first node Node_A voltage to correspond to a data value.

The first initialization circuit 1300 may initialize the first node Node_A in response to a first initialization signal Init_s1 applied to the gate of transistor P1. For example, when the first initialization signal Init_s1 is enabled and turns P1 "on" or conductive, the first initialization circuit 1300 may "initialize" the first node Node_A voltage magnitude to be the magnitude of a first voltage V_dr. the first voltage V_dr may be a voltage for operating the page buffer 1000, the magnitude of which may be greater than the magnitude of a ground (zero volts) or other reference potential greater than voltage VSS.

The first initialization circuit 1300 may include a first transistor P1, which may have a gate to which the first initialization signal Init_s1 is input. First transistor P1 may also have, a source to which the first voltage V_dr is applied, and a drain to which first node Node_A is connected.

The logical operation circuit 1400 may perform logical operations on data, which correspond to one or more different voltage levels of the first node Node_A and a second node Node_B. Furthermore, the logical operation circuit 1400 may "transfer" the electrical charge, on the first node Node_A to the second Node_B, electrical charges being more commonly referred to as voltages. As a result of such transfers, the logical operation circuit 1400 may perform various Boolean operations, examples of which include a Boolean NOT operation, Boolean AND operation, and a Boolean NOR operation. The NOT operation, the AND operation, and a the NOR operation are examples Boolean, i.e., logical operations that may be performed by the logical operation circuit 1400 according to an embodiment of the present disclosure.

The logical operation circuit 1400 may include a first transfer circuit 1410 and a second transfer circuit 1420. The first transfer circuit 1410 is configured to set the voltage on the second node Node_B, as a voltage level corresponding to the voltage level of the first node Node_A in response to a first transfer signal TRAN_o.

For example, when the first transfer signal TRAN_o is enabled, the first transfer circuit 1410 may hold voltage level on the second node Node_B or it may transfer the voltage on the second node Node_B, which may be the voltage VSS, which may be a "ground" voltage e.g., zero volts, or other reference potential, depending upon the existing voltage level of the first node Node_A. When the first transfer signal TRAN_o is enabled and the voltage level of the first node Node_A is voltage V_dr, the first transfer circuit 1410 may transfer the Vss voltage to the second node Node_B. When the first transfer signal TRAN_o is enabled and the voltage level of the first node Node_A is less than the voltage V_dr (e.g., when the voltage level of the first node Node_A is the level of the second voltage VSS), the first transfer circuit 1410 may hold or maintain the voltage level of the second node Node_B.

When the first transfer signal TRAN_o is disabled, the first transfer circuit 1410 may hold the voltage level of the second node Node_B regardless of the voltage level of the first node Node_A.

The first transfer circuit 1410 may include two transistors which are identified in FIG. 1 as N1 and N2.

Transistor N1 may have a gate to which the first transfer signal TRAN_o is input; a source to which the second voltage VSS is applied; and a drain to which a source of the third transistor N2 is connected.

Transistor N2 may have a gate to which the first node Node_A is connected; a drain to which the second node Node_B is connected; and the source to which the drain of the second transistor N1 is connected.

The second transfer circuit 1420 is configured to set the voltage level of the first node Node_A as a voltage level corresponding to the voltage level of the second node Node_B, in response to a second transfer signal TRAN_v.

For example, when the second transfer signal TRAN_v is enabled, the second transfer circuit 1420 may hold or maintain the voltage level of the first node Node_A or it may transfer the voltage level of the first node Node_A, which may be a second voltage VSS, to the second node Node_B, responsive to an existing voltage level of the second node Node_B. When the second transfer signal TRAN_v is enabled and the voltage level of the second node Node_B is the voltage V_dr, the second transfer circuit 1420 may transfer the voltage on the first node Node_A as the level of the second voltage VSS. When the second transfer signal TRAN_v is enabled and the voltage level of the second node Node_B is less than the level of the first voltage V_dr (e.g., when the voltage level of the second node Node_B is the ground voltage VSS), the second transfer circuit 1420 may hold or maintain the voltage level of the first node Node_A.

The second transfer circuit 1420 may include a transistor N3 and transistor N4.

The transistor N3 may have a gate to which the second node Node_B is connected, a drain to which the first node Node_A is connected, and a source to which a drain of the fifth transistor N4 is connected.

The transistor N4 may have a gate to which the second transfer signal TRAN_v is input, the drain to which the source of the transistor N3 is connected, and a source to which the ground voltage VSS is applied.

The page buffer 1000 may also include a second initialization circuit 2000. which may initialize the second node Node_B to an initialization voltage level in response to the second initialization signal Init_s2. For example, when the second initialization signal Init_s2 is enabled, the second initialization circuit 2000 may transfer the voltage V_dr to the second node Node_B. The second initialization circuit 2000 may include transistor P2, which may have a gate to which the second initialization signal Init_s2 is input, a source to which the first voltage V_dr is applied, and a drain to which the second node Node_B is connected.

An operation of the page buffer constructed as above according to an embodiment of the present disclosure may be described as follows.

FIGS. 2 to 7 are diagrams for describing an operation of the page buffer 1000 according to an embodiment of the present disclosure.

First, an operation for a Boolean or "logical" NOT operation is described.

Figure 2:
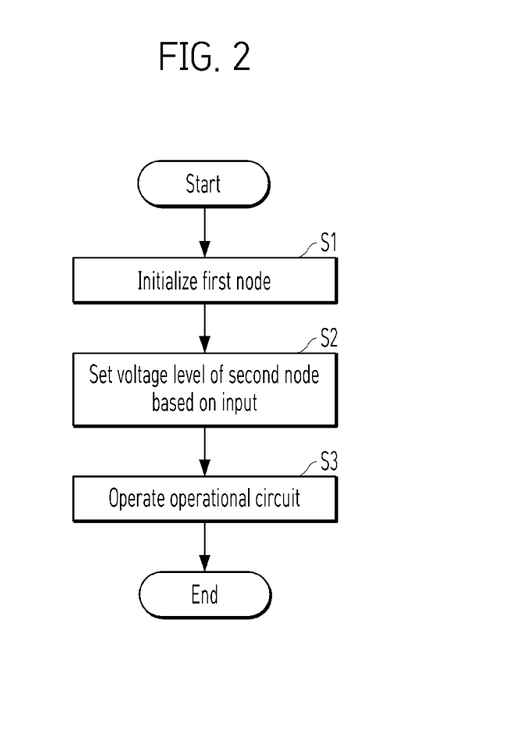
FIGS. 2 to 7 are diagrams for describing an operation of the page buffer according to an embodiment of the present disclosure.
Figure 3:
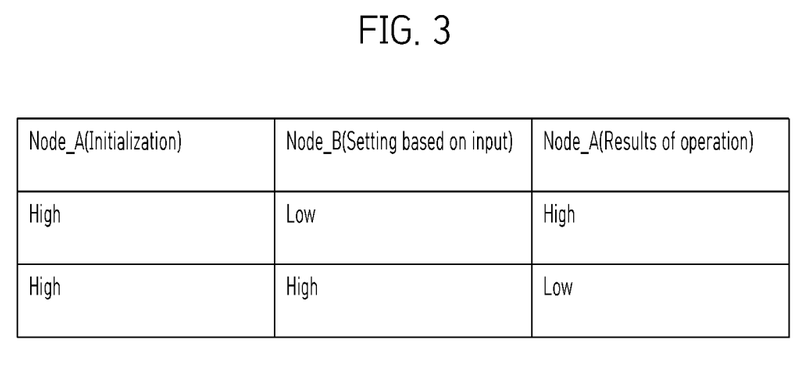

Referring to FIGS. 2 and 3, an operating method 200 for the NOT operation of the page buffer 1000 according to an embodiment of the present disclosure may include a first node initialization step S1, a second node setting step S2 responsive to one or more control input signals, and a logical operation step S3. In such a case, a high digital logic level, i.e., a logic "1" may correspond to the first voltage V_dr. A low digital logic level, i.e., a logic "0" may correspond to the second voltage VSS.

The first node initialization step S1 may include a step of transferring the first voltage V_dr to the first node Node_A. as will happen when the first initialization signal Init_s1 is enabled, i.e., when signal Init_s1 is "low," PMOS transistor P1 is in a conductive state or "turned on." That is, the first node initialization step S1 may include a step of initializing the first node Node_A voltage corresponding to a logic 1 by causing the first initialization signal Init_s1 to be a low level, which for PMOS transistor P1, will cause it to conduct, preferably in its saturation state.

The second node setting step S2 may include a step of setting the voltage level of the second node Node_B responsive to the level of the signal that is to be inverted by the performance of the NOT operation. For example, when the voltage on Node_A is at a high level or logic 1, the second step S2 responsive to may include setting the voltage level of the second node Node_B voltage atto a low level or logic zero, i.e., the level of the second voltage VSS., Node_B can be driven to the second voltage VSS by setting the first transfer signal TRAN_o to a high level or logic 1, which will cause NMOS transistor N1 to conduct, thereby connecting VSS to the source of NMOS transistor N2, which will be in a conductive state because of the previously-set high-level voltage, i.e., logic 1, on Node_A. The voltage on Node_B will therefore be set to VSS.

The logical operation step S3 may be performed by enabling the second transfer signal TRAN_v, which will cause a transfer of a low-level voltage on Node_B on to Node_A, thereby inverting the previously-set high level voltage on Node_A to a low level on Node_B. The logical operation circuit 1400 may thus perform the NOT operation responsive to or responsive to the voltages of Init_s1, VSS, V_dr, TRAN_o, Init_s2, and TRAN_v.

Similarly, in a NOT operation, when the voltage level of the second node Node_B, is a low level and Node_A has been initialized to a high level as in FIG. 3, when the logical operation circuit 1400 is operated, the voltage level of the first node Node_A, may be maintained at a high level, effectively inverting the Node_B voltage, i.e., performing a NOT operation on the Node_B signal. If the voltage level of the second node Node_B, is a high level when first node Node_A has been initialized to a high level, when the logical operation circuit 1400 is operated, the first node Node_A voltage may be changed to a low level.

Figure 4:
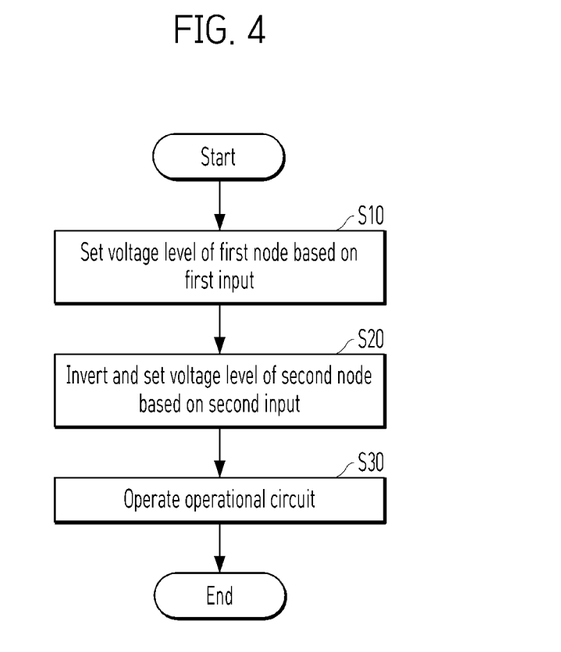
Figure 5:
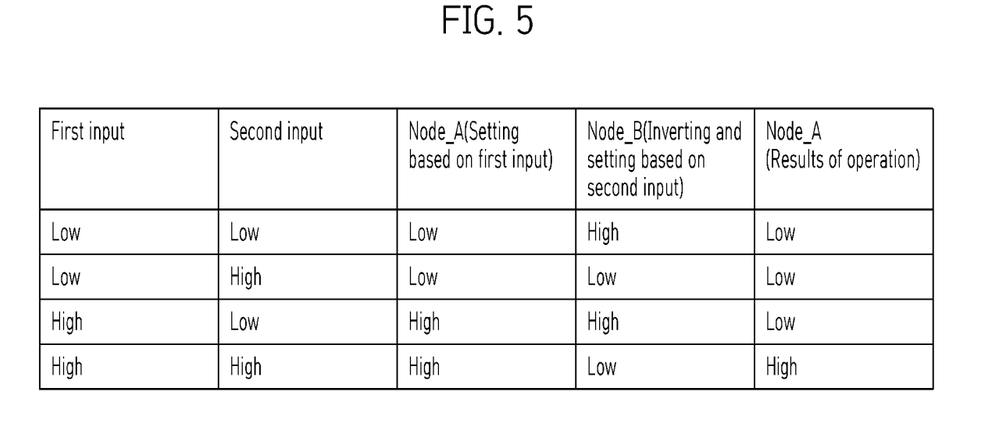

Referring to FIGS. 4 and 5, describe a method 400 of performing the AND operation by the page buffer 1000 according to an embodiment of the present disclosure may include a first node setting step S10 responsive to a first input signal, a second node inversion and setting step S20 responsive to a second input signal, and a logical operation logical operation step S30. In this case, a high level of a digital logic level may correspond to the level of the first voltage V_dr, and a low level of a digital logic level may correspond to the level of the second voltage VSS.

The first node setting step S10 responsive to the first input may include a step of setting the voltage level of the first node Node_A at a level corresponding to the level of the first input to the AND operation. For example, the first node setting step S10 responsive to the first input may include a step of setting the voltage level of the first node Node_A at the level of the second voltage VSS, that is, a low level, if the level of the first input to the AND operation is a low level. Furthermore, the first node setting step S10 responsive to the first input may include a step of setting the voltage level of the first node Node_A as the level of the first voltage V_dr, that is, a high level, if the level of the first input to the AND operation is a high level. More specifically, the first node setting step S10 responsive to the first input may include a step of forming, by the first initialization circuit 1300, the voltage level of the first node Node_A as the level of the first voltage V_dr by enabling the first initialization signal Init_s1 to a low level if the level of the first input to the AND operation is a high level. The first node setting step S10 responsive to the first input may include a step of forming, by the second transfer circuit 1420, the voltage level of the first node Node_A as the level of the second voltage VSS, that is, a low level, by enabling the second transfer signal TRAN_v to a high level in the state in which the voltage level of the second node Node_B is the level of the first voltage V_dr, that is, a high level, if the level of the first input to the AND operation is a low level.

The second node inversion and setting step S20 responsive to the second input may include a step of setting the voltage level of the second node Node_B as a level corresponding to an inversion level of the level of the second input to the AND operation. For example, the second node inversion and setting step S20 responsive to the second input may include a step of setting the voltage level of the second node Node_B as the level of the first voltage V_dr, that is, a high level, if the level of the second input to the AND operation is a low level. Furthermore, the second node inversion and setting step S20 responsive to the second input may include a step of setting the voltage level of the second node Node_B as the level of the second voltage VSS, that is, a low level, if the level of the second input to the AND operation is a high level. More specifically, the second node inversion and setting step S20 responsive to the second input may include a step of forming, by the first transfer circuit 1410, the voltage level of the second node Node_B as the level of the second voltage VSS, that is, a low level, by enabling the first transfer signal TRAN_o to a high level in the state in which the voltage level of the first node Node_A is the level of the first voltage V_dr, if the level of the second input to the AND operation is a high level. The second node inversion and setting step S20 responsive to the second input may include a step of forming, by the second initialization circuit 2000, the voltage level of the second node Node_B as the level of the first voltage V_dr, that is, a high level, by enabling the second initialization signal Init_s2 to a low level, if the level of the second input to the AND operation is a low level.

The logical operation step S30 may be a step of operating the logical operation circuit 1400 by enabling the second transfer signal TRAN_v. The logical operation circuit 1400 may set the results of the AND operation responsive to the first and second inputs as the voltage level of the first node Node_A.

As in FIG. 5, after the voltage level of the first node Node_A is set to a low level responsive to the first input having a low level and the voltage level of the second node Node_B is inverted and set to a high level responsive to the second input having a low level, when the second transfer signal TRAN_v is enabled, the results of the AND operation responsive to the first and second inputs may be formed as the voltage level of the first node Node_A. In this case, the voltage level of the first node Node_A may be a low level.

Furthermore, after the voltage level of the first node Node_A is set to a low level responsive to the first input having a low level and the voltage level of the second node Node_B is inverted and set to a low level responsive to the second input having a high level, when the second transfer signal TRAN_v is enabled, the results of the AND operation responsive to the first and second inputs may be formed as the voltage level of the first node Node_A. In this case, the voltage level of the first node Node_A may be a low level.

Furthermore, after the voltage level of the first node Node_A is set to a high level responsive to the first input having a high level and the voltage level of the second node Node_B is inverted and set to a high level responsive to the second input having a low level, when the second transfer signal TRAN_v is enabled, the results of the AND operation responsive to the first and second inputs may be formed as the voltage level of the first node Node_A. In this case, the voltage level of the first node Node_A may be a low level.

Furthermore, after the voltage level of the first node Node_A is set to a high level responsive to the first input having a high level and the voltage level of the second node Node_B is inverted and set to a low level responsive to the second input having a high level, when the second transfer signal TRAN_v is enabled, the results of the AND operation responsive to the first and second inputs may be formed as the voltage level of the first node Node_A. In this case, the voltage level of the first node Node_A may be a high level.

As described above, the logical operation logical operation circuit 1400 may perform an AND operation by using the voltage levels of the first and second nodes Node_A and Node_B as inputs, and may set the results of the AND operation as the voltage level of the first node Node_A.

Figure 6:
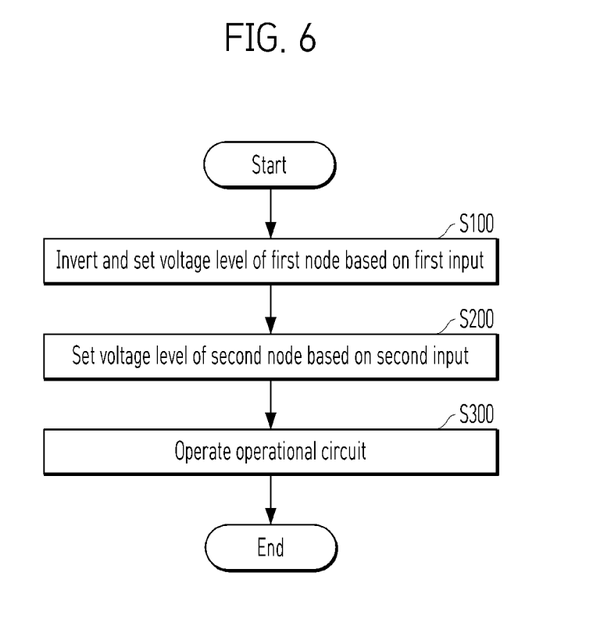
Figure 7:
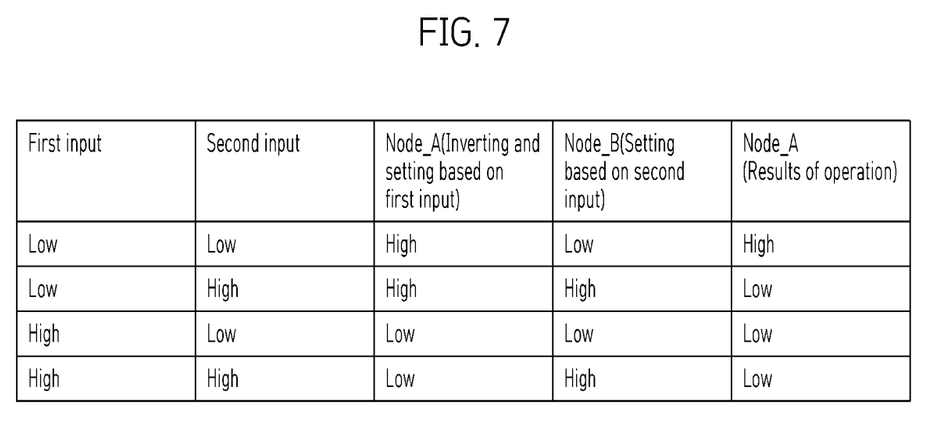

Referring to FIGS. 6 and 7, an operating method for the NOR operation of the page buffer may include a first node inversion and setting step S100 responsive to a first input, a second node setting step S200 responsive to a second input, and a logical operation step S300. In this case, a high level of a digital logic level may correspond to the level of the first voltage V_dr, and a low level of a digital logic level may correspond to the level of the second voltage VSS.

The first node inversion and setting step S100 responsive to the first input may include a step of setting the voltage level of the first node Node_A as a level corresponding to an inversion level of the level of the first input to the NOR operation. For example, the first node inversion and setting step S100 responsive to the first input may include a step of setting the voltage level of the first node Node_A as the level of the first voltage V_dr, that is, a high level, if the level of the first input to the NOR operation is a low level. Furthermore, the first node inversion and setting step S100 responsive to the first input may include a step of setting the voltage level of the first node Node_A as the level of the second voltage VSS, that is, a low level, if the level of the first input to the NOR operation is a high level. More specifically, the first node inversion and setting step S100 responsive to the first input may include a step of setting the voltage level of the first node Node_A as a high level by enabling the first initialization signal Init_s1 to a low level, if the level of the first input to the NOR operation is a low level. Furthermore, the first node inversion and setting step S100 responsive to the first input may include a step of forming, by the first transfer circuit 1410, the voltage level of the first node Node_A as a low level by enabling the first transfer signal TRAN_o to a high level in the state in which the voltage level of the second node Node_B is a high level, if the level of the first input to the NOR operation is a high level.

The second node setting step S200 responsive to the second input may include a step of setting the voltage level of the second node Node_B as a level corresponding to the level of the second input to the NOR operation. For example, the second node setting step S200 responsive to the second input may include a step of setting the voltage level of the second node Node_B as a low level if the level of the second input to the NOR operation is a low level. Furthermore, the second node setting step S200 responsive to the second input may include a step of setting the voltage level of the second node Node_B as a high level if the level of the second input to the NOR operation is a high level. More specifically, the second node setting step S200 responsive to the second input may include a step of forming, by the first transfer circuit 1410, the voltage level of the second node Node_B as a low level by enabling the first transfer signal TRAN_o to a high level in the state in which the voltage level of the first node Node_A is a high level, if the level of the second input to the NOR operation is a low level. Furthermore, the second node setting step S200 responsive to the second input may include a step of forming, by the second initialization circuit 2000, the voltage level of the second node Node_B as a high level by enabling the second initialization signal Init_s2 to a low level, if the level of the second input to the NOR operation is a high level.

The logical operation logical operation step S300 may be a step of operating the logical operation circuit 1400 by enabling the second transfer signal TRAN_v. The logical operation logical circuit 1400 may set the results of the NOR operation responsive to the first and second inputs as the voltage level of the first node Node_A.

As in FIG. 7, after the voltage level of the first node Node_A is inverted and set to a high level responsive to the first input having a low level and the voltage level of the second node Node_B is set to a low level responsive to the second input having a low level, when the second transfer signal TRAN_v is enabled, the results of the NOR operation responsive to the first and second inputs may be formed as the voltage level of the first node Node_A. In this case, the voltage level of the first node Node_A may be a high level.

Furthermore, after the voltage level of the first node Node_A is inverted and set to a high level responsive to the first input having a low level and the voltage level of the second node Node_B is set to a high level responsive to the second input having a high level, when the second transfer signal TRAN_v is enabled, the results of the NOR operation responsive to the first and second inputs may be formed as the voltage level of the first node Node_A. In this case, the voltage level of the first node Node_A may be a low level.

Furthermore, after the voltage level of the first node Node_A is inverted and set to a low level responsive to the first input having a high level and the voltage level of the second node Node_B is set to a low level responsive to the second input having a low level, when the second transfer signal TRAN_v is enabled, the results of the NOR operation according to the first and second inputs may be formed as the voltage level of the first node Node_A. In this case, the voltage level of the first node Node_A may be a low level.

Furthermore, after the voltage level of the first node Node_A is inverted and set to a low level responsive to the first input having a high level and the voltage level of the second node Node_B is set to a high level responsive to the second input having a high level, when the second transfer signal TRAN_v is enabled, the results of the NOR operation responsive to the first and second inputs may be formed as the voltage level of the first node Node_A. In this case, the voltage level of the first node Node_A may be a low level.

As described above, the logical operation circuit 1400 may perform NOR operation using the voltage levels of the first and second nodes Node_A and Node_B as inputs, and may set the results of the NOR operation as the voltage level of the first node Node_A.

As described above, the page buffer 1000 may perform logical operations, such as NOT, AND, and NOR, by using the first and second nodes Node_A and Node_B. Furthermore, a combinational operation of the logical operations may be performed by consecutively performing the logical operations. For example, a NAND operation may be possible by performing an operation for a NOT operation after performing an operation for an AND operation. An OR operation may be possible by performing an operation for a NOT operation after performing an operation for a NOR operation.

Furthermore, it has been described that an operation of setting, by the page buffer 1000, the voltage level of the first node Node_A according to an embodiment of the present disclosure may be performed through operations of the first initialization circuit 1300 and the second transfer circuit 1420 as described above. However, the voltage level of the first node Node_A may be set by at least one of the plurality of latch circuits 1210, 1220, and 1230 that is connected to the first node Node_A.

Figure 8:
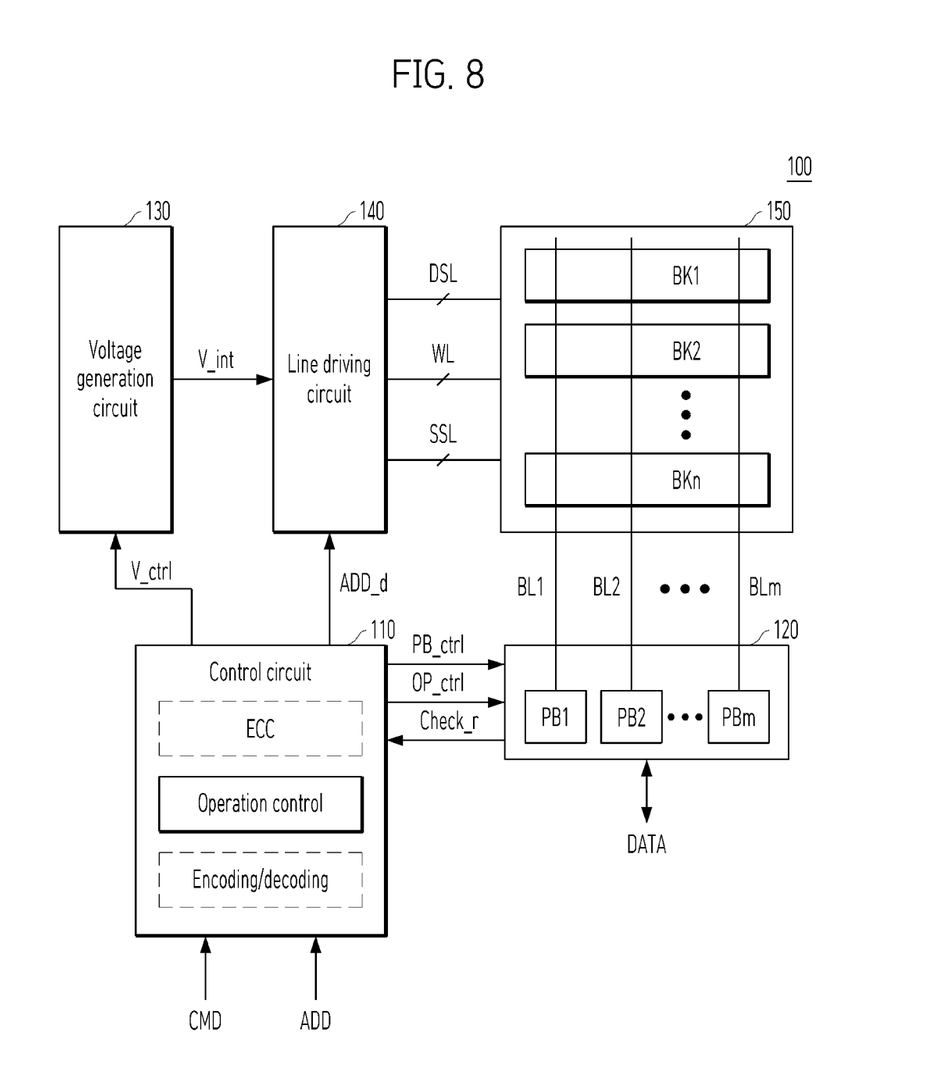
FIG. 8 is a diagram illustrating a construction of a semiconductor device including a page buffer according to an embodiment of the present disclosure.

FIG. 8 is a diagram illustrating a construction of a semiconductor device including a page buffer according to an embodiment of the present disclosure.

Referring to FIG. 8, a semiconductor device 100 according to an embodiment of the present disclosure may include a control circuit 110, a page buffer group 120, a voltage generation circuit 130, a line driving circuit 140, and a memory cell array 150.

The control circuit 110 may program data into the memory cell array 150 or erase data that has been programmed into the memory cell array 150 by controlling the page buffer group 120, the voltage generation circuit 130, and the line driving circuit 140. Furthermore, the control circuit 110 may control the page buffer group 120, the voltage generation circuit 130, and the line driving circuit 140 so that a verification operation is performed on a program after data is programmed into the memory cell array 150 or a verification operation is performed on erase after data that has been programmed into the memory cell array 150 is erased. Moreover, the control circuit 110 may program data into the memory cell array 150 by encoding the data, and may perform a subsequent program verification operation. Furthermore, the control circuit 110 may output, to the outside of the semiconductor device 100, data that has been encoded and programmed into the memory cell array 150 by decoding the data. In this case, the control circuit 110 may encode or decode the data by controlling the page buffer group 120.

The control circuit 110 may generate a page buffer control signal PB_ctrl, responsive to a command signal CMD and an address signal ADD that are received from the outside (e.g., a host), and may provide the page buffer control signal PB_ctrl to the page buffer group 120. Furthermore, the control circuit 110 may provide an operation control signal OP_ctrl to the page buffer group 120 so that a logical operation that is related to encoding or decoding is performed in the page buffer group 120. In this case, the operation control signal OP_ctrl may include the first and second initialization signals Init_s1 and Init_s2 and the first and second transfer signals TRAN_o and TRAN_v illustrated in FIG. 1.

The control circuit 110 may generate a voltage control signal V_ctrl responsive to the command signal CMD, and may provide the voltage control signal V_ctrl to the voltage generation circuit 130.

The control circuit 110 may generate a driving address signal ADD_d responsive to the command signal CMD and the address signal ADD, and may provide the driving address signal ADD_d to the line driving circuit 140.

The page buffer group 120 may include a plurality of page buffers PB1, PB2 to PBm. The plurality of page buffers PB1, PB2 to PBm may be connected to a plurality of bit lines BL1, BL2 to BLm (wherein m is a natural number), respectively. Each of the plurality of page buffers PB1, PB2 to PBm may sense a value of data that has been stored in a memory cell through a bit line, and may output the sensed value as data DATA. Furthermore, the page buffer group 120 may provide verification results Check_r to the control circuit 110 when a program, erase, or read operation is verified.

The voltage generation circuit 130 may generate internal voltages V_int having various voltage levels responsive to the voltage control signal V_ctrl, and may provide the internal voltages V_int to the line driving circuit 140.

The line driving circuit 140 may drive drain selection lines DSL, word lines WL, and source selection lines SSL to the voltage levels of the internal voltages V_int responsive to the driving address signal ADD_d.

The memory cell array 150 may include a plurality of memory blocks BK1, BK2 to BKn (wherein n is a natural number). The plurality of memory blocks BK1, BK2 to BKn is selected by the word lines WL. The memory strings of a selected memory block may be connected to the plurality of page buffers PB1, PB2 to PBm through the bit lines BL1, BL2 to BLm. Furthermore, each of the plurality of memory blocks BK1, BK2 to BKn may include a plurality of memory strings to each of which a plurality of memory cells is connected in series. Each of the plurality of memory strings may include a first selection transistor (e.g., a drain selection transistor) and a second selection transistor (e.g., a source selection transistor) in addition to the plurality of memory cells that is connected in series to each memory string. The first selection transistor may be constructed to be turned on or turned off by the drain selection line DSL. The second selection transistor may be constructed to be turned on or turned off by the source selection line SSL.

Figure 9:
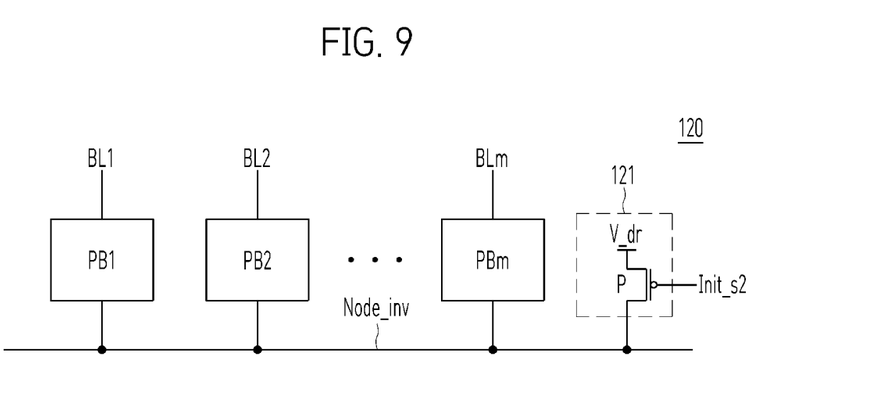
FIG. 9 is a diagram illustrating a construction of a page buffer group including a page buffer according to an embodiment of the present disclosure.

FIG. 9 is a diagram illustrating a construction of a page buffer group including a page buffer according to an embodiment of the present disclosure.

Referring to FIG. 9, the page buffer group 120 may include the plurality of page buffers PB1, PB2 to PBm and an initialization circuit 121.

Each of the plurality of page buffers PB1, PB2 to PBm may be connected to a verification node Node_inv in common, and may be connected to the plurality of bit lines BL1, BL2 to BLm, respectively.

The initialization circuit 121 may initialize the verification node Node_inv responsive to the initialization signal Init_s2. For example, when the initialization signal Init_s2 is enabled to a low level, the initialization circuit 121 may initialize the verification node Node_inv to the level of the first voltage V_dr.

The initialization circuit 121 may include a transistor P having a gate to which the initialization signal Init_s2 is input, a source to which the first voltage V_dr is applied, and a drain to which the verification node Node_inv is connected.

The page buffer group 120 constructed as above may sense data that has been programmed into a memory cell by each of the plurality of page buffers PB1, PB2 to PBm through each bit line when a program is verified, and may transfer electric energy, such as a voltage or current corresponding to the sensed value, to the verification node Node_inv. The electric energy of the verification node Node_inv may be provided to the control circuit 110 as the verification results Check_r. The control circuit 110 may determine whether a program has been completed by sensing the voltage or current of the verification node Node_inv, which is transferred as the verification results Check_r.

Furthermore, the verification node Node_inv may be a node that is also used if sensing values of the plurality of page buffers PB1, PB2 to PBm are determined at once when whether to perform an error correction code (ECC) operation is determined after the start of a read operation, in addition to a verification operation for a program.

Accordingly, the verification node Node_inv may be a node in which sensing values of the plurality of page buffers PB1, PB2 to PBm may be merged.

The verification node Node_inv in FIG. 9 may be a node corresponding to the second node Node_B in FIG. 1. Furthermore, the initialization circuit 121 in FIG. 9 may be a circuit corresponding to the second initialization circuit 2000 in FIG. 1. The verification node Node_inv in FIG. 9 is described as an example of the second node Node_B in FIG. 1, but to use a node which is not used in the semiconductor device after the start of a logical operation according to the present disclosure as the second node Node_B may be a simple design change which may be easily practiced by those skilled in the art.

Figure 10:
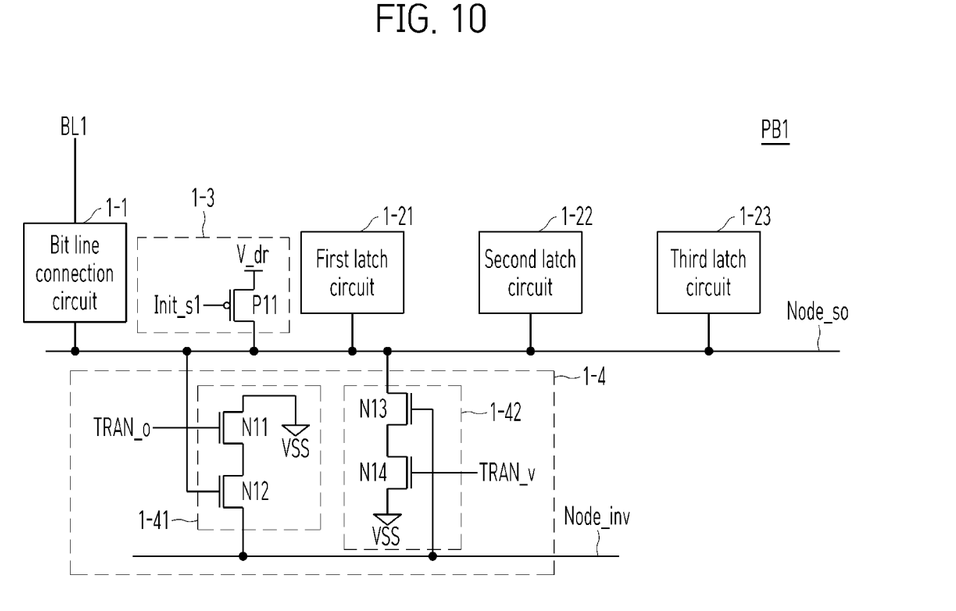
FIGS. 10 and 11 are diagrams illustrating constructions of other page buffers in an embodiment that is included in the page buffer group of FIG. 9.
Figure 11:
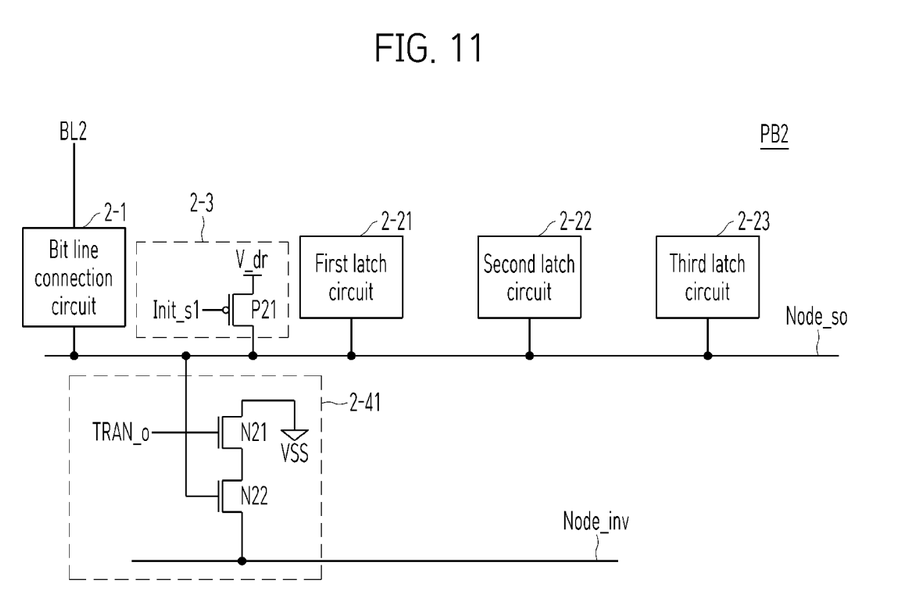

FIGS. 10 and 11 are diagrams illustrating constructions of other page buffers in an embodiment that is included in the page buffer group of FIG. 9.

The page buffer group 120 illustrated in FIG. 9 may include the plurality of page buffers PB1, PB2 to PBm. The page buffer PB1 illustrated in FIG. 10 may illustrate a construction of at least one page buffer among the plurality of page buffers PB1, PB2 to PBm in FIG. 9. FIG. 10 may merely illustrate a first page buffer PB1 as an example, among the plurality of page buffers PB1, PB2 to PBm, and the present disclosure is not limited to the example.

The first page buffer PB1 may perform a logical operation like the page buffer 1000 illustrated in FIG. 1.

Referring to FIG. 10, the first page buffer PB1 may include a bit line connection circuit 1-1, a plurality of latch circuits 1-21, 1-22, and 1-23, an initialization circuit 1-3, and a logical operation 1-4. The first to third latch circuits 1-21, 1-22, and 1-23 in FIG. 10 are merely described as an example of the plurality of latch circuits 1-21, 1-22, and 1-23 that are included in the first page buffer PB1. The number of latch circuits that are included in the page buffer PB1 might not be limited.

The bit line connection circuit 1-1 may electrically connect or disconnect the first bit line BL1 and a latch-common node Node_so, which is functionally the same as the Node_A in FIG. 1. For example, the bit line connection circuit 1-1 may electrically connect the first bit line BL1 and the latch-common node Node_so if an operation that requires the first page buffer PB1 to be connected to a memory cell through the first bit line BL1, such as a program or read operation, is performed.

The first to third latch circuits 1-21, 1-22, and 1-23 may be connected to the latch-common node Node_so in common. Each of the first to third latch circuits 1-21, 1-22, and 1-23 may store data corresponding to the voltage level of the latch-common node Node_so, and may drive the latch-common node Node_so to a voltage level corresponding to the stored data.

The initialization circuit 1-3 may initialize the latch-common node Node_so to the level of the first voltage V_dr responsive to the initialization signal Init_s1. The first voltage V_dr may be a voltage for driving the page buffers PB1, PB2 to PBm, and may be a voltage having a higher level than the ground voltage VSS.

The initialization circuit 1-3 may be a circuit for initializing the latch-common node Node_so to the level of the first voltage V_dr, and may include a transistor P11 having a gate to which the initialization signal Init_s1 is input, a source to which the first voltage V_dr is applied, and a drain to which the latch-common node Node_so is connected. In this case, the initialization circuit 1-3 may be a circuit corresponding to the first initialization circuit 1300 in FIG. 1.

The logical operation circuit 1-4 may perform a logical operation using data corresponding to the voltage levels of the latch-common node Node_so and the verification node Node_inv as inputs. Furthermore, the logical operation circuit 1-4 may set the voltage level of the latch-common node Node_so as a voltage level corresponding to data responsive to the results of the operational operation. In this case, the logical operation circuit 1-4 may perform operational operations, such as a NOT operation, an AND operation, and a NOR operation, identically with the logical operation circuit 1400 illustrated in FIG. 1.

The logical operation circuit 1-4 may include a first transfer circuit 1-41 and a second transfer circuit 1-42.

The first transfer circuit 1-41 may set the voltage level of the verification node Node_Inv as a voltage level corresponding to the voltage level of the latch-common node Node_so, in response to the first transfer signal TRAN_o. For example, when the first transfer signal TRAN_o is enabled to a high level, the first transfer circuit 1-41 may maintain the voltage level of the verification node Node_inv or set the voltage level of the verification node Node_inv as the level of the second voltage VSS, responsive to the voltage level of the latch-common node Node_so. More specifically, for example, when the first transfer signal TRAN_o is enabled and the voltage level of the latch-common node Node_so is the level of the first voltage V_dr, the first transfer circuit 1-41 may set the voltage level of the verification node Node_inv as the level of the second voltage VSS. Furthermore, when the first transfer signal TRAN_o is enabled and the voltage level of the latch-common node Node_so is lower than the level of the first voltage V_dr (e.g., when the voltage level of the latch-common node Node_so is the level of the second voltage VSS), the first transfer circuit 1-41 may maintain the voltage level of the verification node Node_inv. When the first transfer signal TRAN_o is disabled, the first transfer circuit 1-41 may maintain the voltage level of the verification node Node_inv regardless of the voltage level of the latch-common node Node_so.

The first transfer circuit 1-41 may include a transistor N11 having a gate to which the first transfer signal TRAN_o is input and a source to which the second voltage VSS is applied, and a transistor N12 having a gate to which the latch-common node Node_so is connected, a drain to which the verification node Node_inv is connected, and a source to which a drain of the transistor N11 is connected.

The second transfer circuit 1-42 may set the voltage level of the latch-common node Node_so as a voltage level corresponding to the voltage level of the verification node Node_inv, in response to the second transfer signal TRAN_v.

For example, when the second transfer signal TRAN_v is enabled, the second transfer circuit 1-42 may maintain the voltage level of the latch-common node Node_so or set the voltage level of the latch-common node Node_so as the level of the second voltage VSS, responsive to the voltage level of the verification node Node_inv. More specifically, for example, when the second transfer signal TRAN_v is enabled and the voltage level of the verification node Node_inv is the level of the first voltage V_dr, the second transfer circuit 1-42 may set the voltage level of the latch-common node Node_so as the level of the second voltage VSS. Furthermore, when the second transfer signal TRAN_v is enabled and the voltage level of the verification node Node_inv is lower than the level of the first voltage V_dr (e.g., when the voltage level of the verification node Node_inv is the level of the ground voltage VSS), the second transfer circuit 1-42 may maintain the voltage level of the latch-common node Node_so.

The second transfer circuit 1-42 may include a transistor N13 having a gate to which the verification node Node_inv is connected and a drain to which the latch-common node Node_so is connected, and a transistor N14 having a gate to which the second transfer signal TRAN_v is input, a drain to which a source of the transistor N13 is connected, and a source to which the second voltage VSS is applied.

The first page buffer PB1 constructed as above may perform an operation of programming data into a memory cell or sensing data that has been stored in a memory cell through a connection with the first bit line BL1, and may also perform even a logical operation by using the latch-common node Node_so and the verification node Node_inv. For operational operations of the first page buffer PB1, reference may be made to the descriptions of FIGS. 2 to 7.

A second page buffer PB2 illustrated in FIG. 11 may illustrate a construction of at least one page buffer, among the plurality of page buffers PB1, PB2 to PBm illustrated in FIG. 9. FIG. 11 may merely illustrate the second page buffer PB2 as an example, among the plurality of page buffers PB1, PB2 to PBm, and the present disclosure is not limited to the example.

Referring to FIG. 11, the second page buffer PB2 may include a bit line connection circuit 2-1, a plurality of latch circuits 2-21, 2-22, and 2-23, an initialization circuit 2-3, and a transfer circuit 2-41. First to third latch circuits 2-21, 2-22, and 2-23 in FIG. 11 are merely described as the plurality of latch circuits 2-21, 2-22, and 2-23 that are included in the second page buffer PB2, for example, and the number of latch circuits that are included in the page buffer PB2 might not be limited.

The bit line connection circuit 2-1 may electrically connect or disconnect the second bit line BL2 and the latch-common node Node_so. For example, the bit line connection circuit 2-1 may electrically connect the second bit line BL2 and the latch-common node Node_so if an operation that requires the second page buffer PB2 to be connected to a memory cell through the second bit line BL2, such as a program or read operation, is performed. The latch-common node Node_so in FIG. 10 may be a node that is included in a page buffer different from the page buffer of the latch-common node Node_so in FIG. 11, and may have the same name as the latch-common node Node_so in FIG. 11, but may be different from the latch-common node Node_so in FIG. 11.

The first to third latch circuits 2-21, 2-22, and 2-23 may be connected to the latch-common node Node_so in common. Each of the first to third latch circuits 2-21, 2-22, and 2-23 may store data corresponding to the voltage level of the latch-common node Node_so, and may drive the latch-common node Node_so to a voltage level corresponding to the stored data.

The initialization circuit 2-3 may initialize the latch-common node Node_so to the level of the first voltage V_dr in response to the initialization signal Init_s1. In this case, the initialization signal Init_s1 in FIG. 11 may merely have the same name as the initialization signal Init_s1 illustrated in FIG. 10, and may be a different signal that is input to the page buffer different from the page buffer to which the initialization signal Init_s1 illustrated in FIG. 10 is input.

The initialization circuit 2-3 may be a circuit for initializing the latch-common node Node_so to the level of the first voltage V_dr, and may include a transistor P21 having a gate to which the initialization signal Init_s1 is input, a source to which the first voltage V_dr is applied, and a drain to which the latch-common node Node_so is connected.

The transfer circuit 2-41 may set the voltage level of the verification node Node_inv as a level corresponding to the voltage level of the latch-common node Node_so, in response to the transfer signal TRAN_o. For example, when the transfer signal TRAN_o is enabled to a high level, the transfer circuit 2-41 may maintain the voltage level of the verification node Node_inv or set the voltage level of the verification node Node_inv as the level of the second voltage VSS, responsive to the voltage level of the latch-common node Node_so.

The transfer circuit 2-41 may include a transistor N21 having a gate to which the transfer signal TRAN_o is input and a source to which the second voltage VSS is applied, and a transistor N22 having a gate to which the latch-common node Node_so is connected, a drain to which the verification node Node_inv is connected, and a source to which a drain of the transistor N21 is connected.

The second page buffer PB1 constructed as in FIG. 11 might not perform a logical operation unlike the first page buffer PB1 illustrated in FIG. 10, and may set the voltage level of the verification node Node_inv responsive to the voltage level of the latch-common node Node_so.

As a result, the semiconductor device 100 according to an embodiment of the present disclosure may include a page buffer group including a plurality of page buffers. At least one of the plurality of page buffers may be a page buffer capable of performing a logical operation.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A page buffer comprising:
    a bit line connection circuit configured to connect or disconnect a bit line and a first node;
    a plurality of latch circuits, latch circuits being in parallel and connected to the first node; and
    a logical operation circuit operatively coupled to the first node and configured to perform a logical operation on data that is represented by a voltage level on the first node using one or more of a voltage level of the first node and a voltage level of a second node, and configured to set the voltage level of the first node responsive to results of the logical operational operation.

2. The page buffer of claim 1, wherein the logical operation circuit is configured to perform at least one of: a NOT operation on the voltage level of the second node, an AND operation on the voltage level of the first node and the voltage level of the second node and outputting results of the operation for the AND operation to the first node, and a NOR operation on the voltage level of the first node and the voltage level of the second node and outputting results of the operation for the NOR operation to the first node.

3. The page buffer of claim 1, further comprising:
a first initialization circuit configured to set the first node to a first voltage level in response to a first initialization signal, and
a second initialization circuit configured to set the second node to the first voltage level in response to a second initialization signal.

4. The page buffer of claim 3, wherein the logical operation circuit comprises:
a first transfer circuit configured to maintain the voltage level of the second node, or set the voltage level of the second node as a second voltage level responsive to the voltage level of the first node in response to a first transfer signal, and
a second transfer circuit configured to maintain the voltage level of the first node or and set the voltage level of the first node as a second voltage level responsive to the voltage level of the second node in response to a second transfer signal.

5. The page buffer of claim 4, wherein the first voltage level is greater than the second voltage level.

6. The page buffer of claim 4, wherein the logical operation circuit is configured to
set the voltage level of the first node at the first voltage level or the second voltage level responsive to a first input to the logical operation in response to the first initialization signal and the second transfer signal, and
set the voltage level of the second node at the first voltage level or the second voltage level responsive to a second input to the logical operation in response to the second initialization signal and the first transfer signal.

7. The page buffer of claim 6, wherein the logical operation circuit is configured to
perform the logical operation when the second transfer signal is enabled after the voltage levels of the first and second nodes are set responsive to the first and second inputs to the logical operation, and
form result of the logical operation as the voltage level of the first node.

8. The page buffer of claim 1, wherein each of the plurality of latch circuits is configured to
sense a value of data that has been programmed into a memory cell through the bit line when the bit line and the first node are connected, and
store the sensed value.

9. A semiconductor device comprising:
a plurality of page buffers connected to a plurality of bit lines, which are connected in parallel to a verification node; and
a control circuit configured to perform a verification operation responsive to a voltage level of the verification node,
wherein each of page buffer of the plurality of page buffers comprises a latch-common node to which a plurality of latch circuits are connected in parallel to the latch-common node; and
wherein at least one of the plurality of page buffers performs a logical operation on a data represented by a voltage level on the latch-common node, using the voltage level of the verification node and a voltage level of the latch-common node as inputs.

10. The semiconductor device of claim 9, wherein at least one of the plurality of page buffers comprises a logical operation circuit configured to perform the logical operation using the voltage levels of the verification node and the latch-common node as inputs and to set the result of the logical operation as the voltage level of the latch-common node.

11. The semiconductor device of claim 10, wherein at least one of the plurality of page buffers further comprises a first initialization circuit configured to set the voltage level of the latch-common node as a first voltage level in response to a first initialization signal.

12. The semiconductor device of claim 11, further comprising a second initialization circuit configured to set the voltage level of the verification node as a first voltage level in response to a second initialization signal.

13. The semiconductor device of claim 12, wherein the logical operation circuit comprises:
a first transfer circuit configured to maintain the voltage level of the verification node or set the voltage level of the verification node as a second voltage level, based on a first transfer signal and the voltage level of the latch-common node, and
a second transfer circuit configured to maintain the voltage level of the latch-common node or set the voltage level of the latch-common node as the second voltage level, responsive to a second transfer signal and the voltage level of the verification node.

14. The semiconductor device of claim 10, wherein the logical operation circuit is configured to
set the voltage level of the latch-common node responsive to a first input to the operational operation, in response to the first initialization signal and the second transfer signal, and
set the voltage level of the verification node responsive to a second input to the operational operation, in response to the second initialization signal and the first transfer signal.

15. The semiconductor device of claim 14, wherein the logical operation circuit is configured to
perform the operational operation in response to the second transfer signal, when the setting of the voltage levels of the latch-common node and the verification node according to the first and second inputs to the logical operation is completed, and
form results of the operational operation as the voltage level of the latch-common node.

16. A method of operating a semiconductor device having a page buffer, the method, comprising:
setting a voltage level of a first node as a first voltage level or a second voltage level;
setting a voltage level of a second node as the first voltage level or the second voltage level; and
performing a logical operation with the page buffer by using one or more of the voltage levels of the first node and the second node as inputs and outputting results of the operational operation to the first node.

17. The operating method of claim 16, wherein setting the voltage level of the first node as the first voltage level or the second voltage level comprises setting the voltage level of the first node as the first voltage level or the second voltage level responsive to data stored in a latch circuit of a page buffer.

18. The operating method of claim 17, further comprising storing the voltage level of the first node in the latch circuit.

19. The operating method of claim 16, wherein:
the first node comprises a node to which a plurality of latch circuits that is included in a page buffer is connected in common, and
the second node comprises a node to which a plurality of the page buffers is connected in common.

20. The operating method of claim 16, wherein:
the setting of the voltage level of the first node as the first voltage level or the second voltage level comprises setting the voltage level of the first node as the first voltage level, and
wherein setting the voltage level of the second node as the first voltage level or the second voltage level comprises setting the voltage level of the second node as the first voltage level or the second voltage level responsive to a level corresponding to a level of an input, and
performing a logical operation using the voltage levels of the first node and the second node as inputs, respectively, and setting results of the operational operation as the voltage level of the first node comprises performing an operation for a NOT operation using the voltage level of the second node as the input and setting results of the operation for the NOT operation as the voltage level of the first node.

21. The operating method of claim 16, wherein:
the setting of the voltage level of the first node as the first voltage level or the second voltage level comprises setting the voltage level of the first node as the first voltage level or the second voltage level responsive to a level corresponding to a level of a first input,
the setting of the voltage level of the second node as the first voltage level or the second voltage level comprises inverting and setting the voltage level of the second node as the first voltage level or the second voltage level responsive to a level corresponding to an inversion level of a second input, and
performing a logical operation using the voltage levels of the first node and the second node as respective inputs, and setting results of the operational operation as the voltage level of the first node comprises performing an operation for an AND operation using the voltage levels of the first and second nodes as first and second inputs, and setting results of the operation for the AND operation as the voltage level of the first node.

22. The operating method of claim 16, wherein:
the setting of the voltage level of the first node as the first voltage level or the second voltage level comprises setting the voltage level of the first node as the first voltage level or the second voltage level responsive to a level corresponding to an inversion level of a first input,
the setting of the voltage level of the second node as the first voltage level or the second voltage level comprises setting the voltage level of the second node as the first voltage level or the second voltage level responsive to a level corresponding to a level of a second input, and
performing a logical operation using the voltage levels of the first node and the second node as respective inputs and setting results of the operational operation as the voltage level of the first node comprises performing an operation for a NOR operation using the voltage levels of the first and second nodes as the first and second inputs and setting results of the operation for the NOR operation as the voltage level of the first node.

* * * * *